(12) United States Patent
Krumbein et al.

(10) Patent No.: US 6,949,797 B2
(45) Date of Patent: Sep. 27, 2005

(54) SEMICONDUCTOR STRUCTURE COMPRISING A MAGNETORESISTOR

(75) Inventors: Ulrich Krumbein, Rosenheim (DE); Hans Taddiken, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/769,458

(22) Filed: Jan. 30, 2004

(65) Prior Publication Data

US 2004/0256670 A1 Dec. 23, 2004

Related U.S. Application Data

(63) Continuation of application No. PCT/EP02/07297, filed on Jul. 2, 2002.

(30) Foreign Application Priority Data

Jul. 31, 2001 (DE) .......................................... 10137343

(51) Int. Cl.[7] .......................... H01L 29/76; H01L 29/94; H01L 31/062; H01L 31/113; H01L 31/119
(52) U.S. Cl. ....................................... 257/340; 257/409
(58) Field of Search ................................. 257/340, 367, 257/408, 409, 508

(56) References Cited

U.S. PATENT DOCUMENTS

| | | | |
|---|---|---|---|
| 4,172,260 A | 10/1979 | Okabe et al. | |
| 4,288,806 A | 9/1981 | Ronen | |
| 4,614,959 A | 9/1986 | Nakagawa | |
| 6,020,611 A | 2/2000 | Ma et al. | |
| 6,153,916 A | 11/2000 | Roth et al. | |
| 6,172,400 B1 * | 1/2001 | Ng et al. | ..................... 257/343 |

* cited by examiner

*Primary Examiner*—Hoai Pham
(74) *Attorney, Agent, or Firm*—Maginot, Moore & Beck

(57) ABSTRACT

A semiconductor structure comprises a substrate and a source region formed in the substrate. Further, a drain region is formed in the substrate. The drain region comprises a first drain portion with a first doping concentration and a second drain portion with a second doping concentration, which is lower than the first doping concentration. Between the source region and the second drain portion a channel region is defined. Further, a field plate is provided, which is disposed across the junction between the first drain portion and the second drain portion to reduce the gradient of the electrical field at the junction.

19 Claims, 10 Drawing Sheets

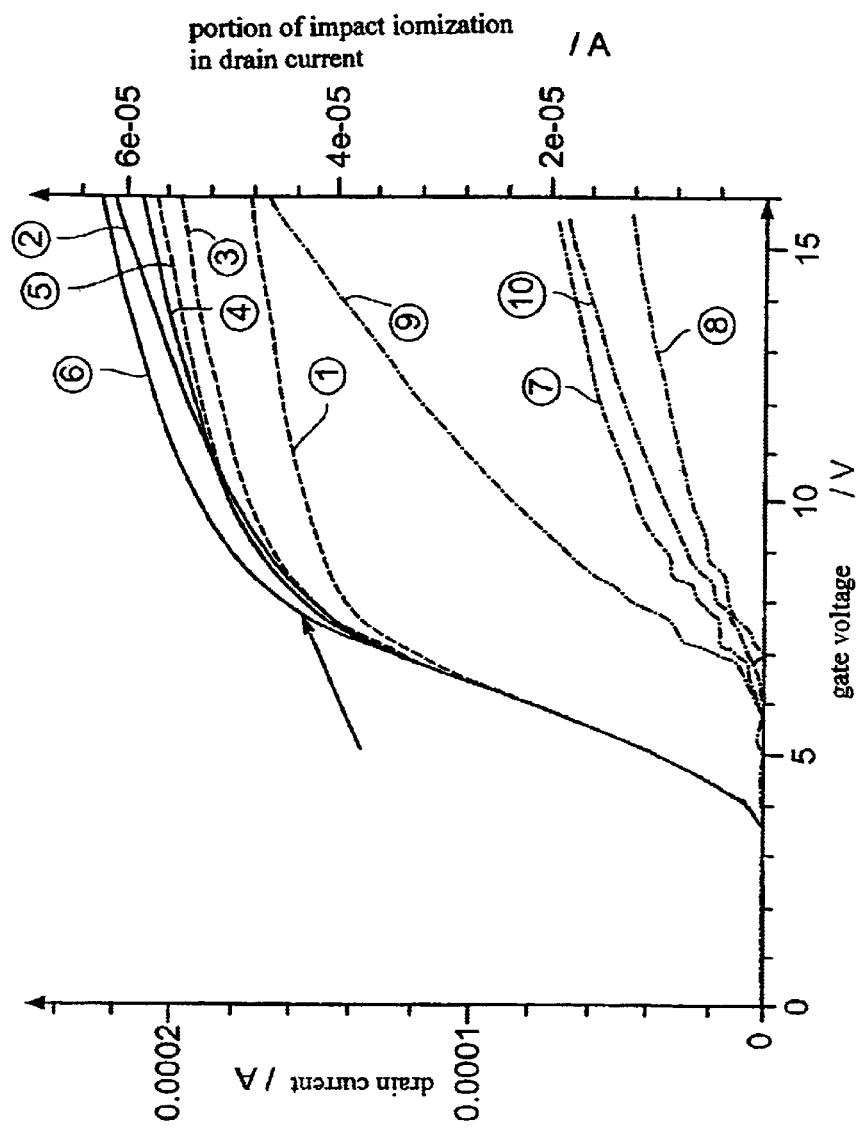

FIG 7

1, without field plate without impact ionization
2, without field plate with impact ionization
3, field plate 23 V without impact ionization
4, field plate 23 V with impact ionization
5, field plate 26 V without impact ionization
6, field plate 26 V with impact ionization
7, field plate 26 V portion of impact ionization
8, field plate 23 V portion of impact ionization
9, without field plate portion of impact ionization
10, field plate 20 V portion of impact ionization 1, field plate = drain
2, field plate 65 V
3, field plate 50 V
4, field plate 60 V
5, field plate 23 V
6, without field plate
7, field plate 70 V

SEMICONDUCTOR STRUCTURE COMPRISING A MAGNETORESISTOR

CROSS-REFERENCE TO RELATED APPLICATION

This application is a continuation of copending International Application No. PCT/EP02/07297, filed Jul. 2, 2002, which designated the United States and was not published in English.

BACKGROUND OF THE INVENTION

1. Field of the Invention

The present invention generally refers to a semiconductor structure, and particularly to a semiconductor structure comprising a source region, a lateral diffused channel region as well as a drain region where a field plate is disposed on the drain end.

2. Description of Prior Art

In the prior art, semiconductor structures with lateral channel regions are known, such as LDMOS transistors (LDMOS=Lateral Diffused Metal Oxide Semiconductor). Such LDMOS transistors comprise a long drain region on the drain end, also referred to as LDD (LDD=Lightly Doped Drain). It is the disadvantage of such structures that an increased impact ionisation occurs in the area of the connection of the LDD to the drain contact implantation with higher drain voltages and drain currents. The electron-hole pairs generated that way cause an additional current not flowing through the channel of the transistor. This additional current, which is not flowing through the channel of the transistor, is undesirable and is to be avoided.

One solution to this problem, as it is known from the prior art, is to provide an additional implantation region between the lightly doped drain and the drain implantation, wherein a doping concentration of the additional implantation region lies between a doping concentration of the lightly doped drain region and the drain implantation. Thereby the concentration gradient is decreased, which reduces the impact ionisation.

With reference to FIG. 9, a known LDMOS transistor according to the prior art is discussed in more detail. The semiconductor structure in FIG. 9 is in its totality provided with reference number 100 and comprises a substrate 102 of p-material, in which the structures of the LDMOS transistor are generated.

A source region 104 with a high n$^+$-doping is formed in the substrate 102. A source contact 106 made from a metal connected with the source connection S is disposed on the source region 104. Further, a drain region 108 with a high n$^+$-doping is formed in the substrate 102. A drain contact 110 is disposed on the drain region and connected to a drain connection D. A gate oxide 112 is disposed on the substrate 102, and a gate contact 114 out of metal connected to a gate connection G is disposed thereon. Below the gate oxide 112 the channel region 116 of the LDMOS transistor structure is fixed. Between the channel region 116 and the drain region 108 a lightly doped drain region (LDD) 118 with a low n$^-$-doping is formed. Between the lightly doped drain region 118 and the drain region 108 an intermediate region with an n-doping is formed, which lies between the n$^+$-doping of drain region 108 and the n$^-$-doping of the lightly doped drain region 118. The arrangement of the intermediate region 120 leads to a reduction of the doping concentration gradient, whereby an impact ionisation in the region of the actual drain implantation, the drain region 108, is reduced.

Arrangements as described with reference to FIG. 9 are for example known from U.S. Pat. No. 4,172,260 and U.S. Pat. No. 6,020,611.

In FIG. 10, a voltage distribution between the gate region and the drain region of the LDMOS transistor from FIG. 9 is illustrated schematically. In the example shown in FIG. 10, a voltage $U_{gate}$ of 16 V is applied to gate connection G, and a drain voltage $U_{drain}$ of 26 V is applied to the drain connection D. In a first region A, mainly extending in the substrate region 102 to below the gate region 114 and the source region 104, the potential lies at about −0.55 V. In region B, adjacent to region A, the potential lies between about 6.224 V and about 13 V. In region C, extending starting from a region below the drain region 108 across the edge areas of the intermediate region 102 and the LDD 118 across the regions 118 and 120, the voltage lies in the range between about 13 V to about 20 V. In region D, comprising the drain region 108 as well as a region above it and the largest part of the intermediate region 120 as well as the region above, the voltage lies in the range between about 20 V to about 26 V.

From FIG. 10, the range of the raised voltage above the drain region 108 and the intermediate region 120 as well as in the border region of the two areas can be seen. Due to the high gradient of electrical potential predominating there, a significant impact ionisation generating a corresponding current still occurs, despite the achieved reduction of the doping concentration gradient.

SUMMARY OF THE INVENTION

In accordance with one aspect, the present invention provides a Semiconductor structure having a substrate; a source region formed in the substrate; a drain region formed in the substrate, the drain region having a first drain portion with a first doping concentration and a second drain portion with a second doping concentration, which is lower than the first doping concentration; a drain contact in contact with the first drain portion; a channel region between the source region and the second drain portion, the channel region bordering on the source region and on the second drain portion; a gate above the channel region; and a conductive field plate laterally spaced apart from the junction between the channel region and the second drain portion and disposed across the junction between the first drain portion and the second drain portion to reduce a gradient of the electric field at the junction, the field plate being disposed at a distance from the gate and the drain contact.

The present invention is based on the knowledge that a further reduction of the impact ionisation can be achieved by using a field plate in the drain region of a semiconductor structure, such as a LDMOS transistor, a predetermined voltage can be applied to the field plate according to a preferred embodiment, to affect the parameters of the transistor structure.

According to an embodiment of the present invention the field plate is disposed directly on the substrate to form a high-impedance contact or a Schottky-diode to the semiconductor material of the substrate and the drain region below it, respectively. In another embodiment, the field plate is disposed on an isolating layer, such as an oxide layer, which is also disposed on the substrate, so that the field plate is separated from the substrate by the oxide.

According to another embodiment, a voltage can be applied to the field plate that can lie within a range of 20 V to 80 V, wherein the voltage may not exceed the drain voltage to raise the breakdown voltage of the drain region.

In another embodiment, the field plate is directly connected to the drain contact so that the voltage at the field plate corresponds to the drain voltage.

According to a preferred embodiment of the present invention, the first drain portion comprises an intermediate region having a third doping concentration, which is higher than the second doping concentration and lower than the first doping concentration. The intermediate region is disposed adjacent to the second drain portion.

BRIEF DESCRIPTION OF THE DRAWINGS

In the following, preferred embodiments of the present invention are discussed in more detail with reference to the accompanying drawings. They show:

FIG. 7 a graph showing the curve of the drain current and the portion of the impact ionisation in the drain current with and without field plate versus the gate voltage;

DESCRIPTION OF PREFERRED EMBODIMENTS

Figure 1:
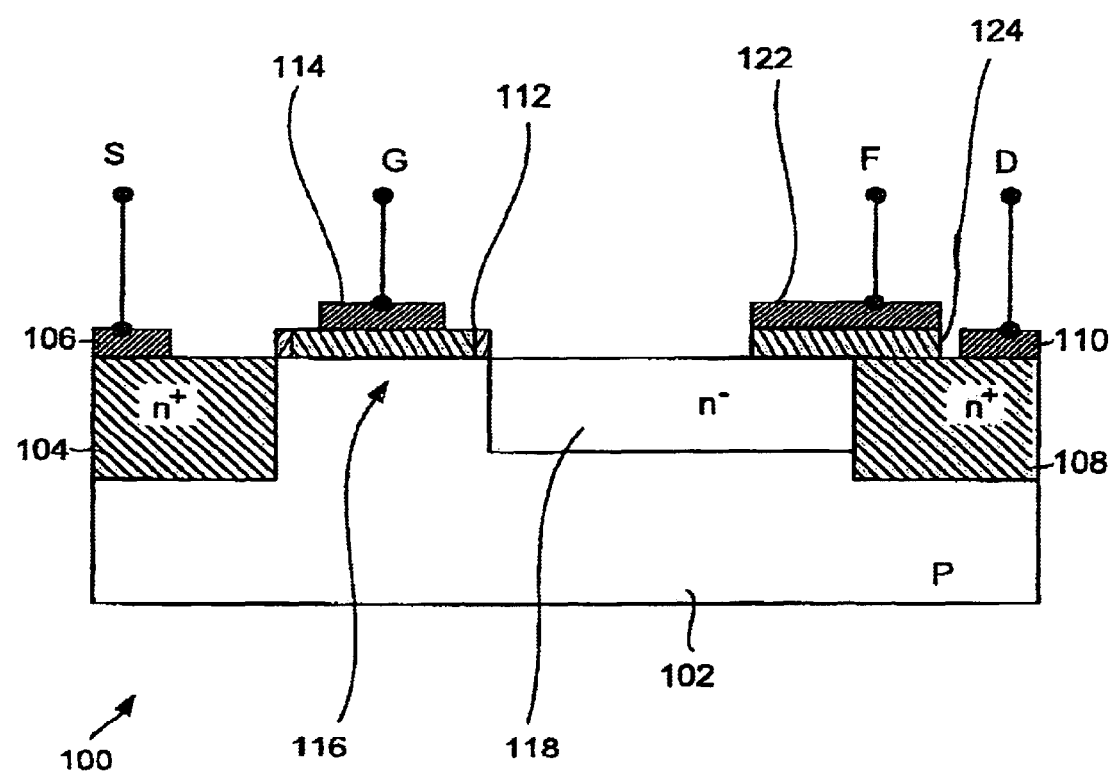
FIG. 1 a schematic representation of a LDMOS transistor with a field plate according to a first embodiment of the present invention.

With reference to FIG. 1, a first embodiment of the present invention will be discussed in more detail below. Regarding the subsequent description of the preferred embodiment it should be noted that similar, equal and equal acting elements are provided with the same reference numbers in the different Figures.

Figure 9:
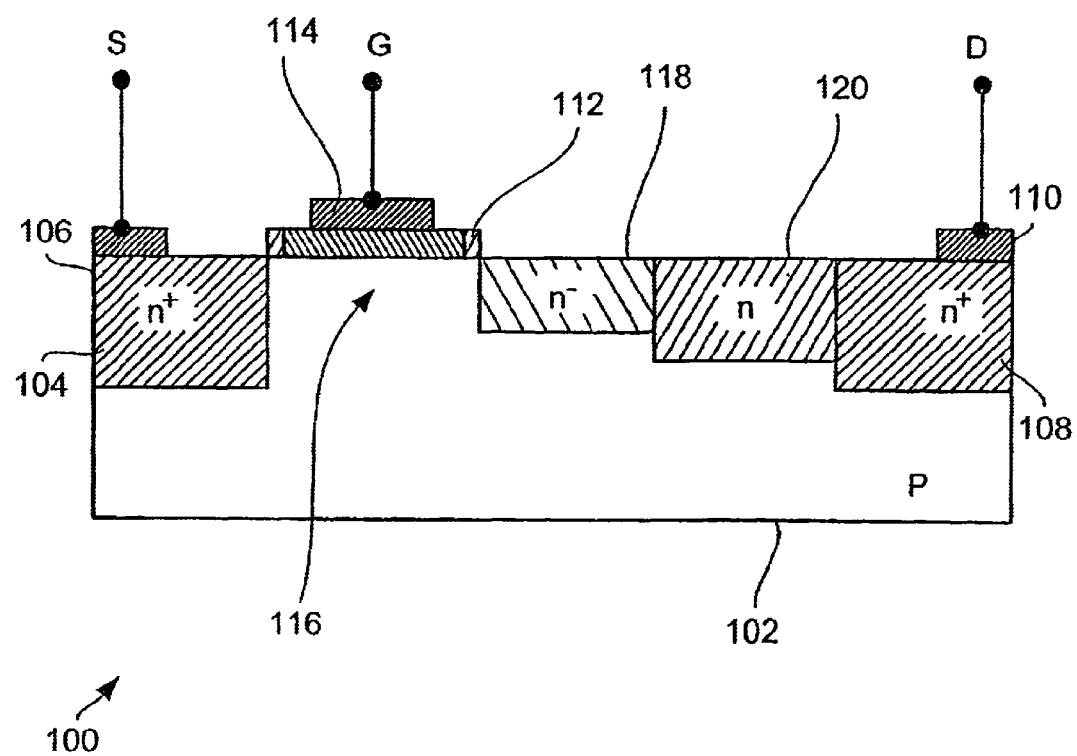
FIG. 9 a LDMOS transistor according to the prior art.

In FIG. 1, a first embodiment of the inventive semiconductor structure is illustrated, wherein elements that have already been described with reference to FIG. 9 are provided with the same reference numbers and are not described again.

In comparison to the semiconductor structure shown in FIG. 9, the semiconductor structure 100 shown in FIG. 1 does not comprise an intermediate region 120. In the embodiment illustrated in FIG. 1, only the LDD 118 is provided, extending between the highly doped drain region 108 and the channel region 116. According to the present invention, the semiconductor structure 100 additionally comprises a field plate 122 disposed across the junction between the LDD 118 and the region 108. An isolating layer 124, such as an oxide layer, is disposed between the field plate 122 and the silicon substrate 102. In the illustrated embodiment, the field plate 122 is connected to a field plate connection F. Alternatively, the field plate can be directly disposed on the substrate 102 and acts then as a high impedance contact or as Schottky-diode.

The field plate 122 is formed of a conductive material. An electric voltage can be applied to he field plate and causes a respective change of the electric field lines depending on the position of the field plate and the applied electrical voltage, so that the voltage gradient and thus the impact ionisation is reduced. Besides the reduction of the impact ionisation due to using the field plate 122, this has further advantageous effects on the operational characteristics of the transistor shown in FIG. 1. On the one hand, the maximum current in a upper characteristic curve region of the transistor can be raised, a sharp bend of the characteristic curve only occurs with higher gate voltages. It is another advantage of using the field plate that it enables an increase of breakdown voltage with an appropriate choice of applied voltage.

The above-described advantages will be discussed in more detail below with reference to further embodiments and further Figures.

Figure 2:
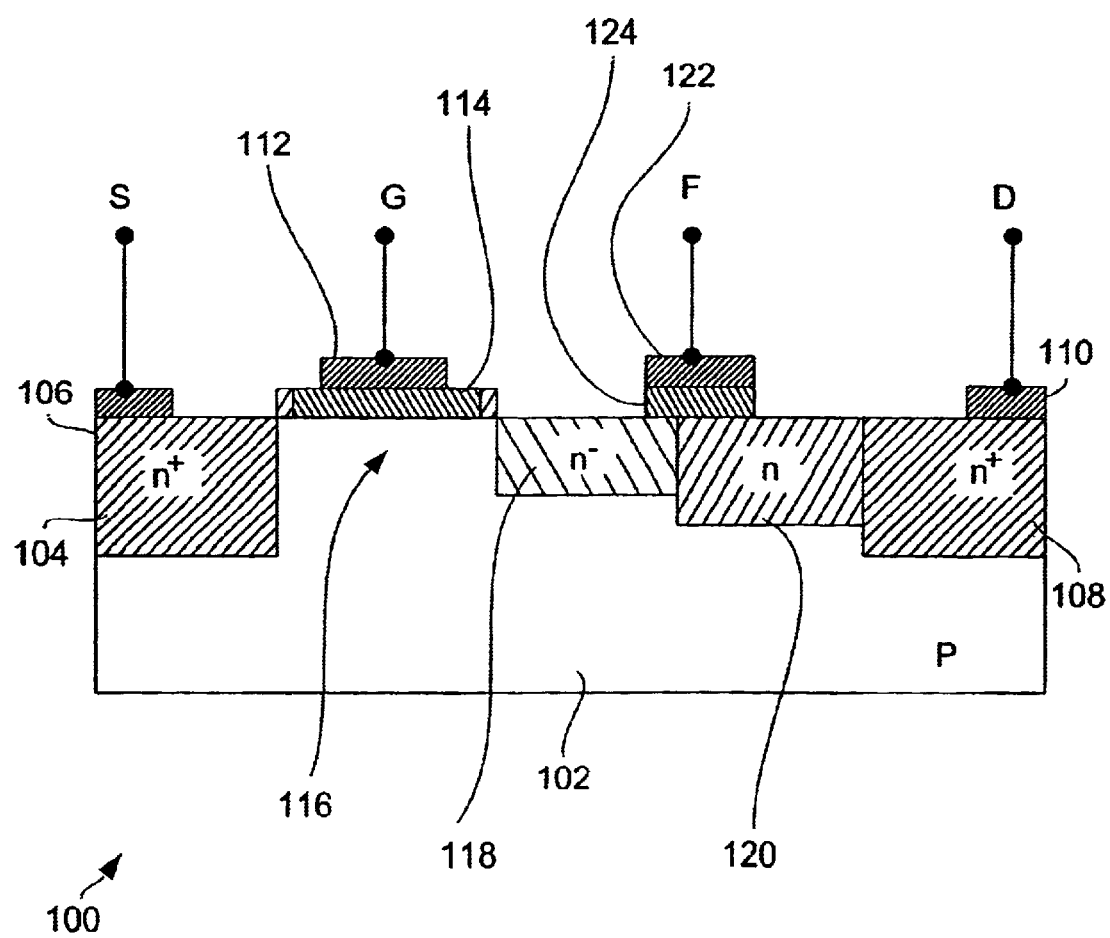
FIG. 2 a schematic representation of a LDMOS transistor with a field plate according to a second embodiment of the present invention.

With reference to FIG. 2, another preferred embodiment of the present invention will be discussed in more detail below. The semiconductor structure illustrated in FIG. 2 is a LDMOS transistor having a structure similar to the one in FIG. 9. Additionally, the structure has the field plate 122, which is moved back with regard to the first portion 108 in the embodiment shown in FIG. 2, and disposed in a region above the LDD 118 and further extends across the intermediate portion 120.

Figure 3:
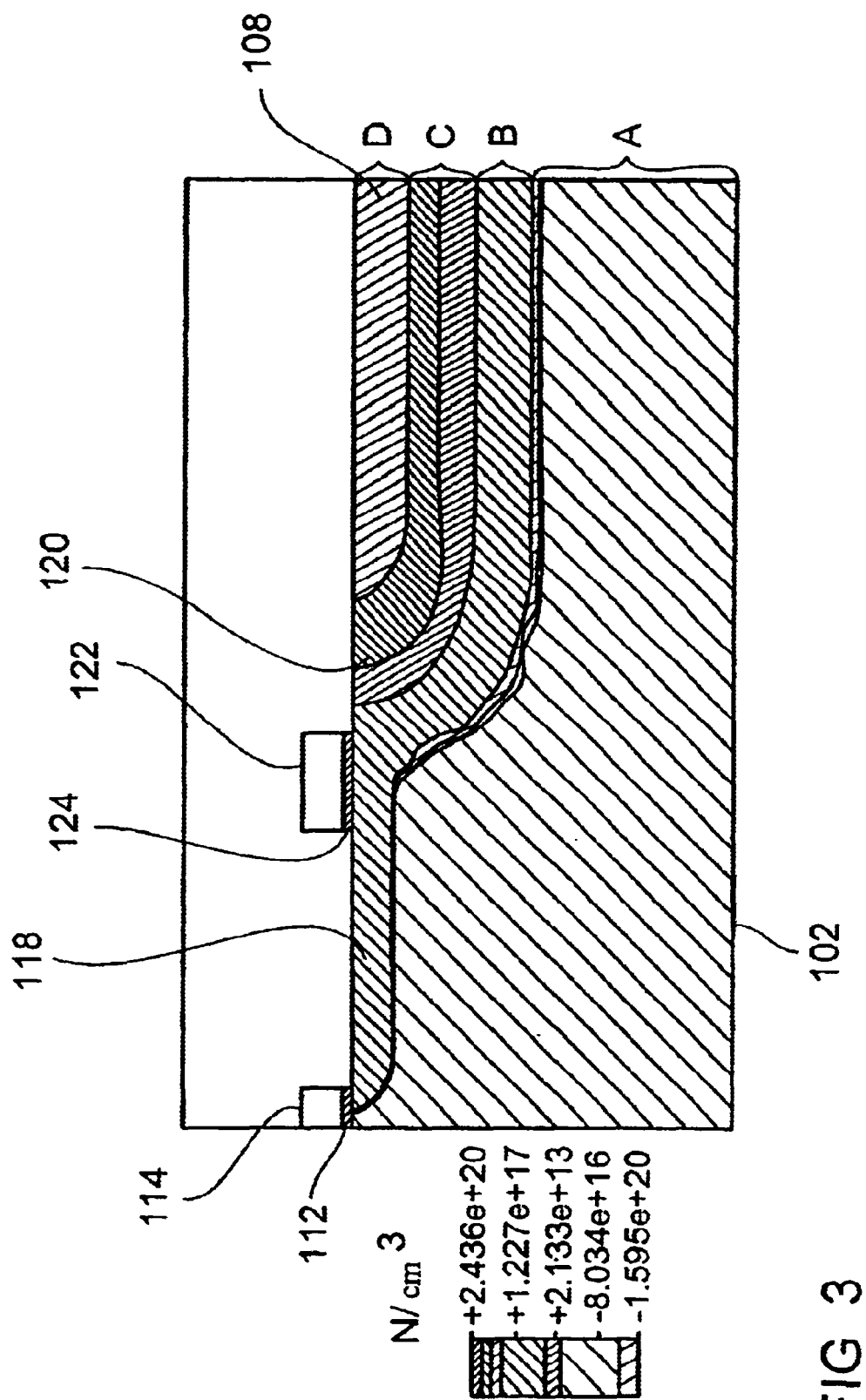
FIG. 3 a schematic representation of the doping distribution between the gate region and the drain region of the LDMOS transistor of FIG. 2.

In FIG. 3, the doping course between the gate region and the drain region of LDMOS transistor of FIG. 2 is illustrated schematically. In region A the doping concentration of the p-material lies at about $8 \times 10^{16}$ $1/cm^3$. In region B, the n-doping concentration lies between $2.1 \times 10^{13}$ $1/cm^3$ to $1.2 \times 10^{17}$ $1/cm^3$. In region C, the doping concentration lies in the range of $1.3 \times 10^{17}$ $1/cm^3$. In region D, the p-doping lies at about $2.4 \times 10^{20}$ $1/cm^3$. The region A comprises the p-substrate, the portions of the p-substrate lying outside the n-doped regions. The region B in FIG. 3 extends from that region below the drain 108 into the LDD 118, and in this region the lowest doping concentration in comparison to the doping concentrations in the intermediate portion 120 and the first drain portion 108 occurs. The region C extends below drain 108 into the intermediate region 120 and has a doping concentration, which is larger than in region 118 but smaller than in the drain region 108. The drain region 108 is doped strongest in region D.

Figure 4:
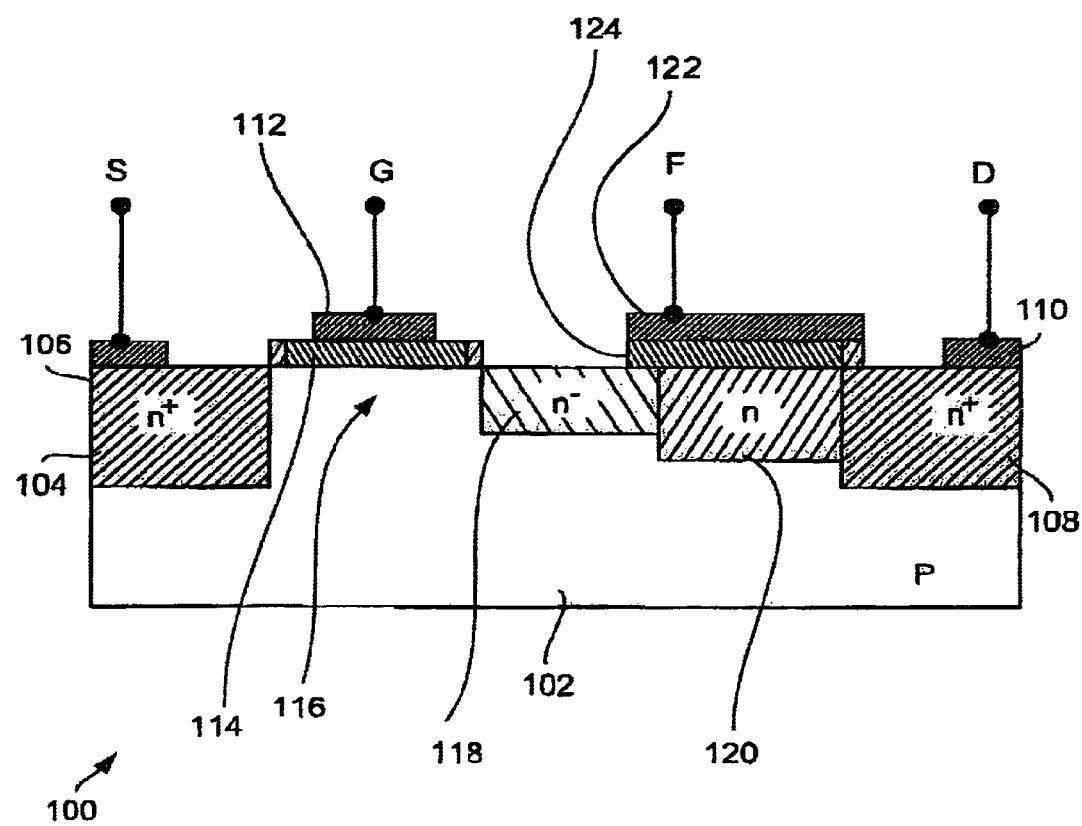
FIG. 4 a schematic representation of a LDMOS transistor with a field plate according to a third embodiment of the present invention.

In FIG. 4, a third embodiment of the inventive field plate is illustrated tin connection with a LDMOS transistor. Unlike the embodiment illustrated in FIG. 2, the field plate 122 is not moved back with regard to the first drain portion 1O8, but extends starting from portion 108 to across drain region 120.

Figure 5:
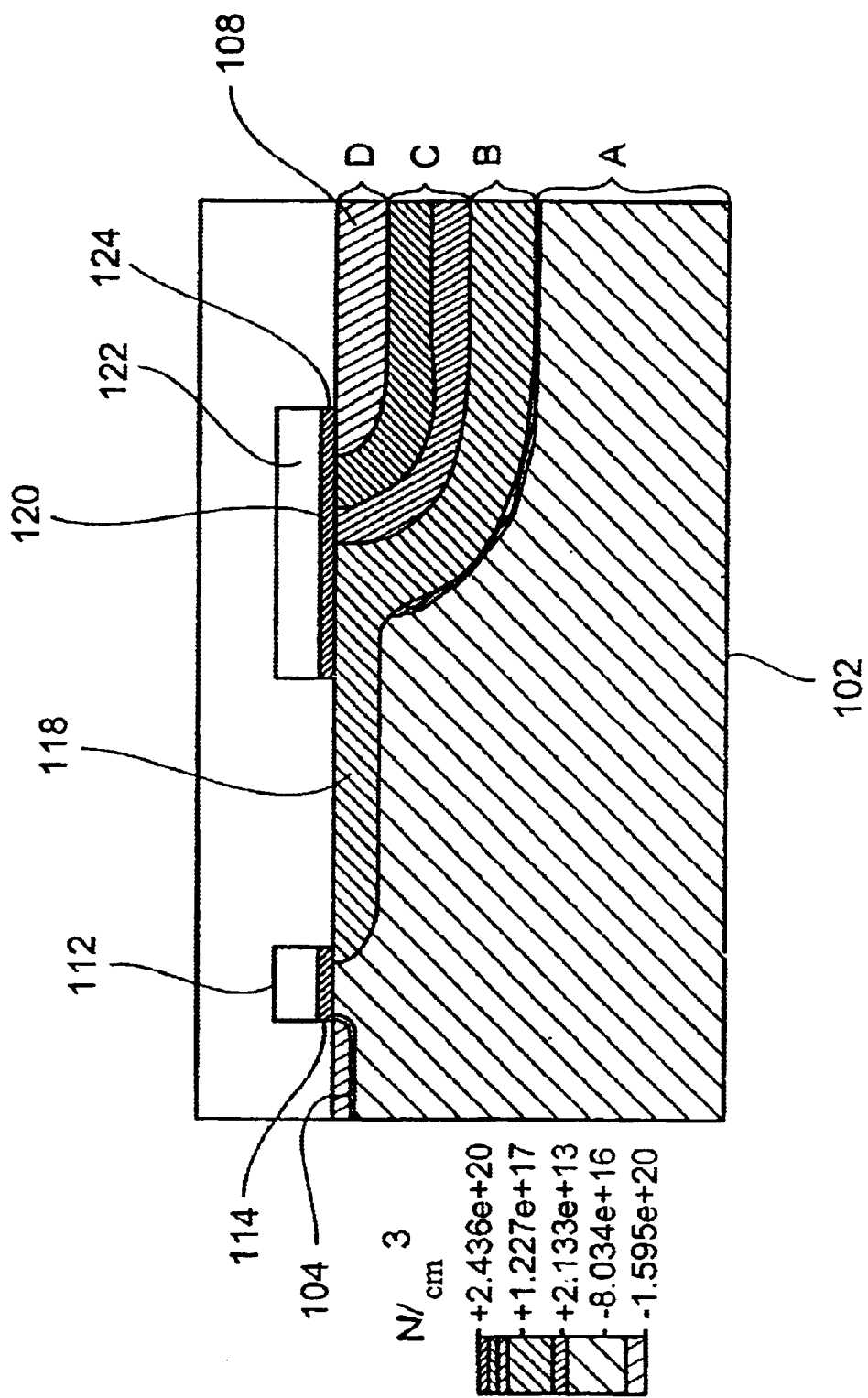
FIG. 5 a schematic representation of the doping distribution between the gate region and the drain region of the LDMOS transistor of FIG. 4.

In FIG. 5 the doping distribution between the source region 104 and the drain region 108 is shown. In the source region, the n-doping concentration is about $2.4 \times 10^{20}$ $1/cm^3$. In region A, extending below the drain region 108 in the substrate 102 below portion 118, below gate region 112 and below source region 104, the p-doping concentration is about $8 \times 10^{16}$ $1/cm^3$. In region B, extending from below the drain region 108 into portion 118, the n-doping concentration lies below $2 \times 10^{13}$ $1/cm^3$ and $1.3 \times 10^{17}$ $1/cm^3$. In region C, extending below the drain region 108 to the intermediate region 120, the n-doping concentration lies in a range of about $1.3 \times 10^{17}$ 1/cm$^3$ to $2 \times 10^{20}$ 1/cm$^3$. In region D, mainly corresponding the region below drain 108 the doping concentration lies at about $2.5 \times 10^{20}$ 1/cm$^3$.

Figure 6:
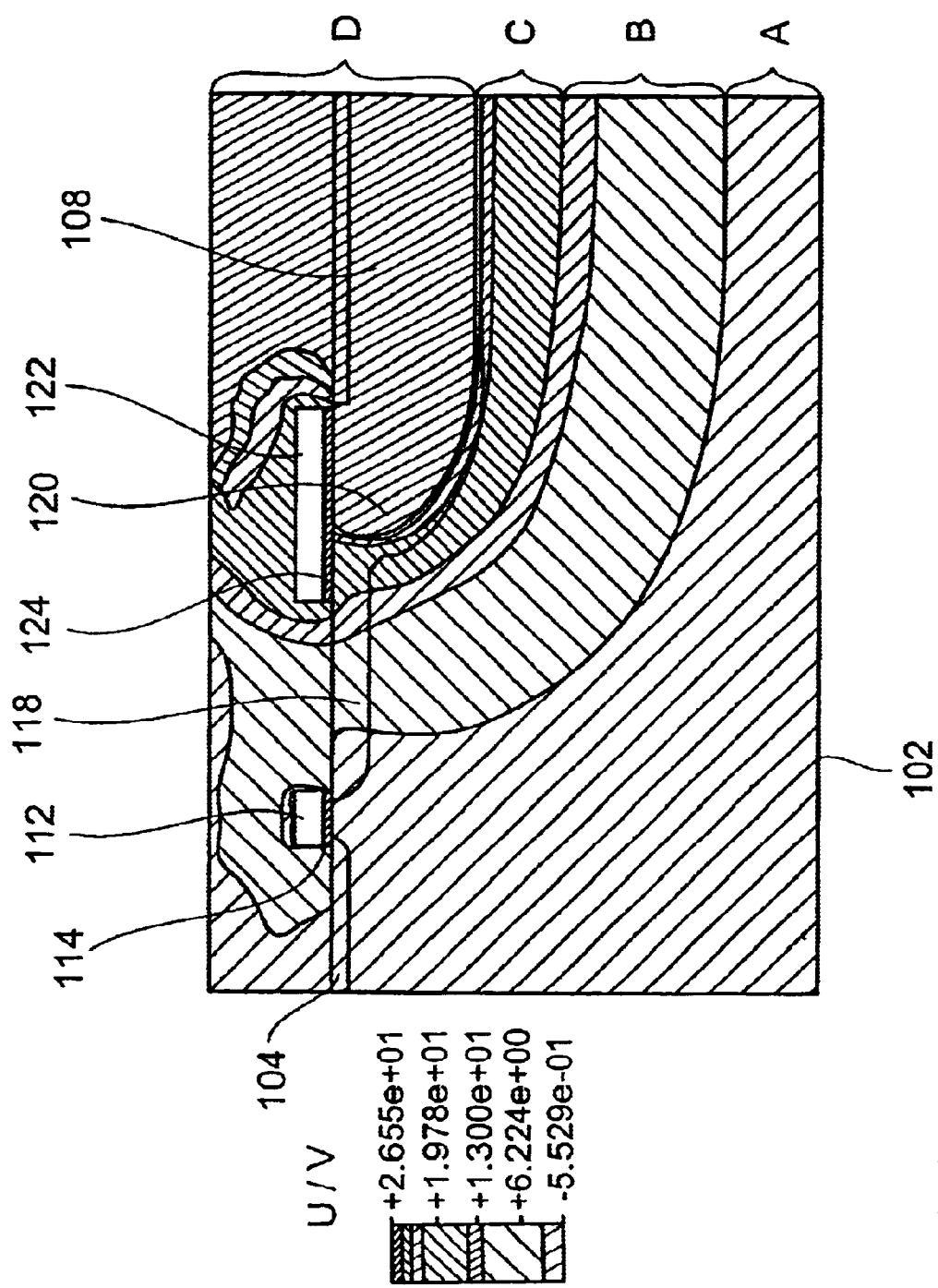
FIG. 6 a schematic representation of the voltage distribution between the gate region and the drain region of the LDMOS transistor of FIG. 5.

In FIG. 6, the voltage distribution between the gate region and the drain region of the LDMOS transistor from FIG. 4 is shown with a doping distribution according to FIG. 5. A drain voltage $U_{drain}$ of 26 V and a gate voltage $U_{gate}$ of 16 V are applied to the LDMOS transistor. In region A, within the substrate and below the gate region (channel region 116) and in a part of portion 118 the voltage lies at about −0.55 V. In region B, extending into region 118, starting from a portion below the drain region 108, the voltage lies in a range of about 6 V to 13 V. In region C, extending starting from a portion below the drain region 108 into a border region between region 118 and intermediate region 120 and around the field plate 122, the voltage lies in a range of about 13 V to about 20 V. In region C, extending below the drain region 108 into the intermediate region 120 below the field plate 122 and above the drain region into a region outside the field plate, the voltage lies between 20 V and 26 V.

Figure 10:
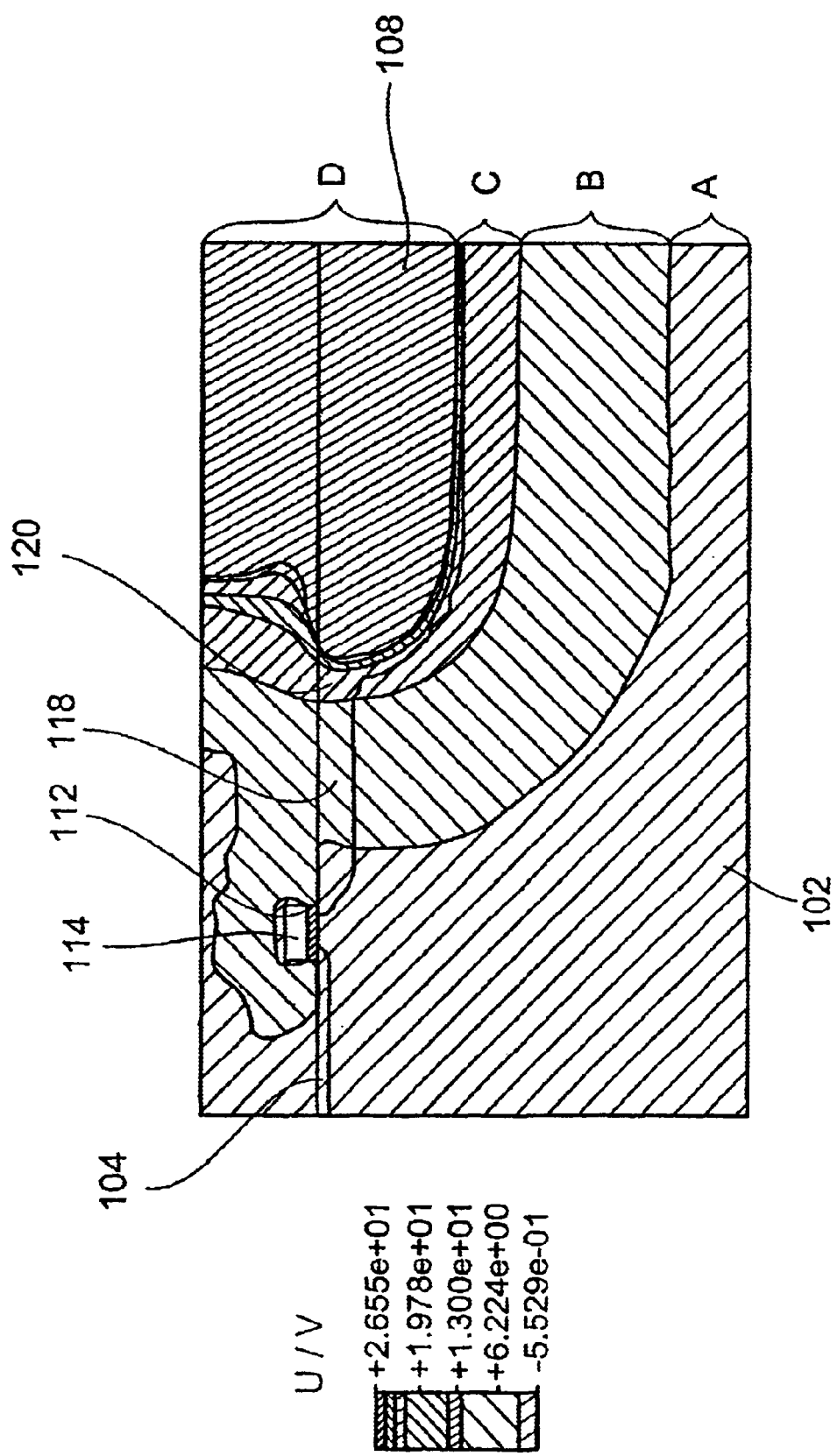
FIG. 10 a schematic representation of the voltage distribution between the gate region and the drain region of the LDMOS transistor of FIG. 9.

In the embodiment illustrated with reference to FIG. 4 to 6, an additional implantation 120 occurs between portion 118 and drain region 108, similar to the prior art, wherein, as mentioned, the doping concentration of the additional implantation lies between the doping concentration of portion 118 and the drain region. Additionally, according to the preferred embodiment, a structure of conductive material is formed, namely the field plate 122 disposed above the intermediate region 120. An electrical voltage can be applied to the field plate and with an appropriate choice of the position of the field plate and the electrical voltage this achieves a change of the electrical field lines so that the voltage gradient will be reduced and thus the impact ionisation will be decreased. From a comparison of FIG. 10, showing an arrangement without field plate, with FIG. 6, showing an arrangement with field plate, the pushing back of potential lines by the field plate 122 can be seen.

In FIG. 7, a graph illustrating the course of the drain current versus the gate voltage, plotted above the x-axis, is illustrated. The left y-axis designates the floating drain current and the right y-axis designates the portion of the current of the drain current originating from an impact ionisation. In FIG. 7, ten curves are shown, representing the drain current and the proportionate current due to impact ionisation for arrangements without field plate and for arrangements with different voltages applied to a field plate. Curves 1 to 6 represent the course of the drain current (plotted on the left y-axis in FIG. 7). Curves 7 to 10 represent the course of the portion of the drain current coming from the impact ionisation (plotted on the right y-axis in FIG. 7).

The curve 1 shows the course of the drain current versus the gate voltage for an arrangement as it is for example shown with reference to FIG. 9, which means an arrangement without field plate. The curve 1 shows the course of the drain current on the assumption that no impact ionisation occurs. The curve 2 shows the course of the drain current versus the gate voltage on the assumption that an impact ionisation is present. As can be seen, the drain current is significantly increased in comparison to curve 1. Curve 9 shows the portion of the current that is generated due to the impact ionisation in such an arrangement. As can be seen, the course of curve 9 raises almost linearly, beginning at about 7 V gate voltage and reaches a value of about $4.7 \times 10^{-5}$ A at about 15 V gate voltage.

The course of curve 3 and the course of curve 5 represent the course of the drain current versus the gate voltage for an arrangement illustrated in FIG. 4, on the assumption that no impact ionisation occurs, wherein in this case a voltage of 23 V or of 26 V, respectively, is applied to the field plate. Curves 4 and 6 show the course of such an arrangement in applying a voltage of 23 V and 26 V, respectively, to the field plate on the assumption that an impact ionisation occurs. As can be seen from the course of the curves, a raised current results due to the impact ionisation, in comparison with the case without impact ionisation, which is caused due to the additional current generated by the impact ionisation. Curves 7 and 8 represent the portion of the current of the total drain current generated due to impact ionisation, and as can be seen, curves 7 and 8 rise flatter in comparison to FIG. 9 and achieve a lower end value, so that the portion of the impact ionisation current is significantly reduced when using the field plate and providing it with different voltages in comparison to the arrangement without field plate (see curve 9). Curve 10 designates the portion of the impact ionisation when a voltage value of 20 V is applied to the field plate.

As can be seen in the graph of FIG. 7, the impact ionisation causes an increase of drain current, especially in the upper characteristic curve region. The difference of the two curves has occurred on the right y-axis. From FIG. 7, the advantages of the transistor with field plate can be clearly recognised. It is one advantage that the impact ionisation is reduced due to the field plate. Further, in comparison to curves 1 and 2, an increase of the maximum current in the upper characteristic curve area results (curve 6). It is another advantage that the characteristic curve only shows a sharp bend at higher gate voltages, as the arrow in FIG. 7 illustrates it.

Figure 8:
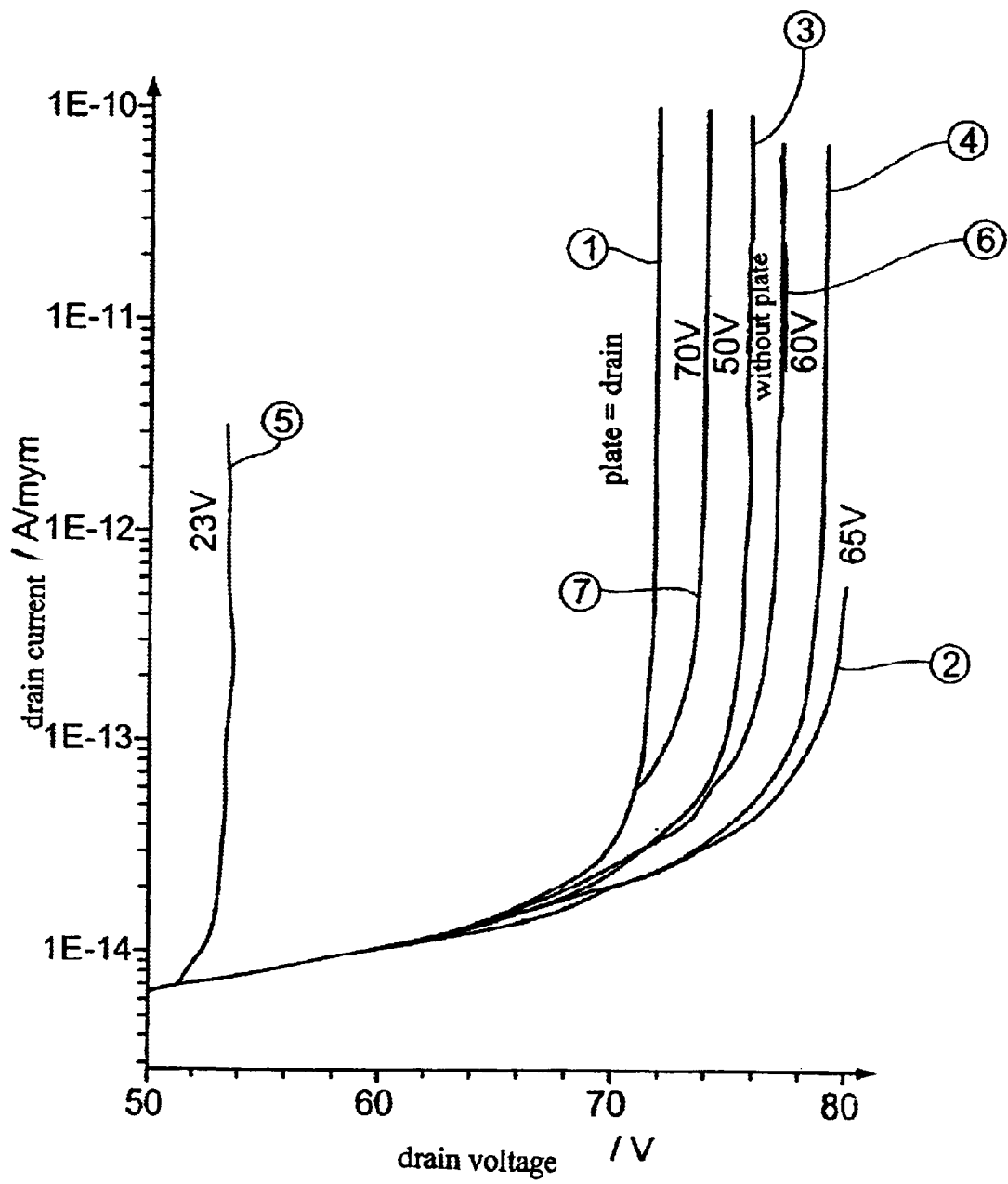
FIG. 8 a graph illustrating the influence of the field plate on the breakdown voltage.

Another advantage of using the inventive field plate will be discussed below with reference to FIG. 8, showing a graph illustrating the chance of breakdown voltage with the usage of the field plate. A structure is assumed that has been described with reference to FIG. 4. The curve 1 shows the course of the drain current versus the drain voltage for an embodiment where the field plate is connected with the drain connection, which means the drain voltage is applied to the field plate 122. Curves 2, 3, 4, and 5 show courses of curves at the field plate for voltages of 65 V, 50 V, 60 V, and 23 V, respectively. Curve 6 shows the course of the drain current when no field plate is provided, which means in an embodiment as it has been described with reference to FIG. 9. The curve 7 designates the course of the drain current versus the drain voltage, when a voltage of 70 V is applied to the field plate.

As can be seen from FIG. 8, it is another advantage of the present invention that using the field plate and providing it with an appropriate voltage can control the breakthrough behaviour of the transistor. As can be seen, the breakdown voltage when compared to a transistor arrangement without a field plate can be displaced over a wide range, depending on the voltage value applied to the field plate. If a voltage of 60 or 65 V is chosen, the breakdown voltage increases, whereupon when applying 70 V, 50 V, or 23 V, a displacement of the drain voltage downwards results, in comparison to an arrangement without plate. The same is true when the field plate has a voltage that corresponds to the drain voltage.

As has been mentioned above, two embodiments of the field plate are possible, wherein a predetermined voltage can be applied to the field plate in one embodiment, e.g. by an external circuit. In the second embodiment, the field plate is floating, which means it is not provided with a defined potential. Further, the field plate can be directly disposed on the substrate or an isolating intermediate layer, for example out of an oxide, can be provided between the field plate and the substrate.

According to the invention, an appropriate circuit can be provided for applying a voltage to the field plate, the circuit receiving a drain voltage applied to the semiconductor structure and setting the voltage applied to the field plate to an optimum value depending on the received drain voltage. The optimum value is determined by measuring the transistor characteristic curves at different voltages on the field plate. Optimum values for a voltage at the field plate are such where the above described advantages, such as low impact ionisation, high breakdown voltage are achieved, and, for example, the impact ionisation and the breakdown voltage take on optimum values.

According to another embodiment, the circuit is formed such that the voltage applied to the field plate is held to a constant portion of the drain voltage. This is a simple approximation of the optimum values. The voltage can be generated from the drain voltage by a simple voltage divider, for example.

In another embodiment, the circuit is formed such that the voltage at the field plate corresponds to the drain voltage. This is a simplification and can be implemented with as little effort as possible. The advantage of the simple implementation predominates in this case the not fully optimum performance of the transistor.

As has been discussed above, the field plate can either be separated from the substrate by an oxide or can be disposed directly on the substrate and forms a high-impedance contact or a Schottky-diode.

Although the above description of the preferred embodiments has occurred with regard to a p-silicon substrate it is understood that instead of the described n-channel LDMOS transistor a p-channel LDMOS transistor can be provided with the inventive field plate, and the present invention is further not restricted to the material silicon, but other materials, such as GaAs, are also possible for the production of transistors.

Instead of the arrangement designated in FIG. 2 and 3 and 4 to 8, respectively, the inventive advantages of the reduction of impact ionisation can also be achieved when the intermediate region 120 is omitted and the field plate is exclusively disposed over the junction between the LDD and the drain region, as it is shown in FIG. 1.

Further, it should be noted, that instead of the shown dimensions of the field plate it can also be formed such, that it extends mainly across the intermediate portion, and maybe also into the first drain portion.

According to a preferred embodiment, the field plate is made of polysilicon and has a thickness of 0.3 $\mu$m to 1.5 $\mu$m.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A semiconductor structure comprising
   a substrate;
   a source region formed in the substrate;
   a drain region formed in the substrate, the drain region having a first drain portion with a first doping concentration and a second drain portion with a second doping concentration, which is lower than the first doping concentration;
   a drain contact in contact with the first drain portion;
   a channel region between the source region and the second drain portion, the channel region bordering on the source region and on the second drain portion;
   a gate above the channel region; and
   a conductive field plate laterally spaced apart from the junction between the channel region and the second drain portion and disposed across the junction between the first drain portion and the second drain portion to reduce a gradient of the electric field at the junction, the field plate being disposed at a distance from the gate and the drain contact.

2. The semiconductor structure according to claim 1, wherein an isolating layer is disposed on the substrate, whereon the field plate is disposed.

3. The semiconductor structure of claim 1, wherein the field plate is disposed on the substrate.

4. The semiconductor structure of claim 1, wherein a voltage can be applied to the field plate.

5. The semiconductor structure of claim 4, wherein the voltage applicable to the field plate is in the range of 20 V to 80 V.

6. The semiconductor structure of claim 5, wherein a breakdown voltage of the drain region is set depending on a voltage applied to the field plate.

7. The semiconductor structure of claim 4, wherein the voltage applicable to the field plate is controlled depending on the drain voltage.

8. The semiconductor structure of claim 1, wherein the first drain portion has an intermediate region with a third doping concentration, which is higher than the second doping concentration and lower than the first doping concentration, the intermediate region being disposed adjacent to the second drain portion.

9. The semiconductor structure of claim 8, wherein the first doping concentration lies in the range of $1 \times 10^{20}$ atoms/cm$^3$, the second doping concentration lies in a range of $1 \times 10^{20}$ atoms/cm$^3$, and the third doping concentration in the range of $1 \times 10^{17}$ atoms/cm$^3$ and $2 \times 10^{20}$ atoms/cm$^3$.

10. The semiconductor structure of claim 8, wherein the field plate extends across the intermediate portion.

11. The semiconductor structure of claim 1, wherein the field plate is made of polysilicon.

12. The semiconductor structure of claim 1, wherein the filed plate has a thickness of 0.3 $\mu$m and 1.5 $\mu$m.

13. A semiconductor structure comprising
    a substrate;
    a source region formed in the substrate;
    a drain region formed in the substrate, the drain region having a first drain portion with a first doping concentration and a second drain portion with a second doping concentration, which is lower than the first doping concentration;
    a drain contact coupled to the first drain portion;
    a channel region between the source region and the second drain portion, the channel region bordering on the source region and on the second drain portion and forming a first junction with the second drain portion;
    a gate above the channel region; and
    a conductive field plate laterally spaced apart from the first junction between the channel region and the second drain portion and disposed across a second junction between the first drain portion and the second drain portion to reduce a gradient of the electric field at the second junction, the field plate being disposed at a distance from the gate and the drain contact.

14. The semiconductor structure of claim 13, wherein a voltage can be applied to the field plate.

15. The semiconductor structure of claim 14, wherein a breakdown voltage of the drain region is set depending on a voltage applied to the field plate.

16. The semiconductor structure of claim 14, wherein the voltage applicable to the field plate is controlled depending on a voltage applied to the drain.

17. A semiconductor structure comprising a substrate;

a source region formed in the substrate;

a drain region formed in the substrate, the drain region having a first drain portion with a first doping concentration and an intermediate region with a third doping concentration, which is lower than the first doping concentration, and a second drain portion with a second doping concentration, which is lower than the first doping concentration, and wherein the intermediate region of the first drain portion is disposed adjacent to the second drain portion and the third doping concentration is higher than the second doping concentration;

a drain contact coupled to the first drain portion;

a channel region between the source region and the second drain portion, the channel region bordering on the source region and on the second drain portion and forming a first junction with the second drain portion;

a gate above the channel region; and a conductive field plate laterally spaced apart from the first junction between the channel region and the second drain portion and disposed across a second junction between the first drain portion and the second drain portion to reduce a gradient of the electric field at the second junction, the field plate being disposed at a distance from the gate and the drain contact.

18. The semiconductor structure of claim 17, wherein the first doping concentration is on the order of $1 \times 10^{20}$ atoms/cm$^3$, the second doping concentration is on the order of $1 \times 10^{20}$ atoms/cm$^3$, and the third doping concentration is in the range of about $1 \times 10^{17}$ atoms/cm$^3$ to about $2 \times 10^{20}$ atoms/cm$^3$.

19. The semiconductor structure of claim 17, wherein the field plate extends across the intermediate portion.

* * * * *